US008715416B2

(12) United States Patent
Narushima et al.

(10) Patent No.: US 8,715,416 B2
(45) Date of Patent: May 6, 2014

(54) DOPING APPARATUS FOR SIMULTANEOUSLY INJECTING TWO DOPANTS INTO A SEMICONDUCTOR MELT AT DIFFERENT POSITIONS AND METHOD FOR MANUFACTURING SILICON SINGLE CRYSTAL USING THE DOPING APPARATUS

(75) Inventors: Yasuhito Narushima, Omura (JP); Shinichi Kawazoe, Omura (JP); Fukuo Ogawa, Omura (JP); Toshimichi Kubota, Omura (JP)

(73) Assignee: Sumco Techxiv Corporation, Nagasaki (JP)

( * ) Notice: Subject to any disclaimer, the term of this patent is extended or adjusted under 35 U.S.C. 154(b) by 597 days.

(21) Appl. No.: 12/524,331

(22) PCT Filed: May 23, 2008

(86) PCT No.: PCT/JP2008/059509
§ 371 (c)(1),
(2), (4) Date: Jul. 23, 2009

(87) PCT Pub. No.: WO2008/149687
PCT Pub. Date: Dec. 11, 2008

(65) Prior Publication Data
US 2010/0031871 A1 Feb. 11, 2010

(30) Foreign Application Priority Data
May 31, 2007 (JP) ................................ 2007-146081

(51) Int. Cl.
*C30B 15/04* (2006.01)
(52) U.S. Cl.
USPC ................. 117/214; 117/13; 117/19; 117/21; 117/28; 117/200; 117/206; 117/208; 117/221

(58) Field of Classification Search
USPC ............... 117/13, 19, 21, 206, 208, 214, 221, 117/912, 931–932, 28, 200
See application file for complete search history.

(56) References Cited

U.S. PATENT DOCUMENTS

| 5,553,566 | A | | 9/1996 | Chiou et al. | |
|---|---|---|---|---|---|
| 5,744,396 | A | * | 4/1998 | Chiou et al. | ................. 438/501 |

(Continued)

FOREIGN PATENT DOCUMENTS

| JP | 59-156993 A | 9/1984 |
|---|---|---|
| JP | 01-246197 A | 10/1989 |

(Continued)

OTHER PUBLICATIONS

English Language International Search Report dated Sep. 2, 2008 issued in parent Appln. No. PCT/JP2008/059509.

(Continued)

*Primary Examiner* — Michael Kornakov
*Assistant Examiner* — Kenneth A Bratland, Jr.
(74) *Attorney, Agent, or Firm* — Holtz, Holtz, Goodman and Chick, PC

(57) ABSTRACT

A doping device includes a first dopant accommodating portion including an opening on an upper portion to accommodate a first dopant that is evaporated near a surface of a semiconductor melt; a second dopant accommodating portion including a dopant holder that holds a second dopant that is liquefied near the surface of the semiconductor melt while including a communicating hole for delivering the liquefied dopant downwardly, and a conduit tube provided on a lower portion of the dopant holder for delivering the liquefied dopant flowed from the communicating hole to the surface of the semiconductor melt; and a guide provided by a cylinder body of which a lower end is opened and an upper end is closed for guiding dopant gas generated by evaporation of the first dopant to the surface of the semiconductor melt.

6 Claims, 9 Drawing Sheets

(56) References Cited

U.S. PATENT DOCUMENTS

| | | | |
|---|---|---|---|
| 6,059,876 A * | 5/2000 | Yin et al. | 117/19 |
| 6,660,082 B2 * | 12/2003 | Weber et al. | 117/19 |
| 6,902,618 B2 | 6/2005 | Iida | |
| 7,132,091 B2 * | 11/2006 | Kulkarni et al. | 423/324 |
| 2004/0069214 A1 * | 4/2004 | Choi et al. | 117/213 |
| 2006/0035448 A1 | 2/2006 | Krautbauer et al. | |
| 2011/0049438 A1 * | 3/2011 | Kawazone et al. | 252/512 |

FOREIGN PATENT DOCUMENTS

| | | |
|---|---|---|
| JP | 09-007961 A | 1/1997 |
| JP | 2000-319087 A | 11/2000 |
| JP | 2002-145694 A | 5/2002 |
| JP | 2004-137140 A | 5/2004 |
| JP | 2004-175658 A | 6/2004 |
| JP | 2004-307305 A | 11/2004 |
| JP | 2005-223092 A | 8/2005 |
| JP | 2006-052133 A | 2/2006 |

OTHER PUBLICATIONS

English-language translation of the International Search Reportand Written Opinion that issued on Jan. 12, 2010 in a counterpart International Application No. PCT/JP/2008/059509.

U.S. Appl. No. 12/602,479; First Named Inventor: Shinichi Kawazone; Title: "Process for Production of Silicon Single Crystal, and Highly Doped N-Type Semiconductor Substrate"; filed Nov. 30, 2009.

Shiriashi, et al.: "Prediction of solid-liquid interface shape during CZ Si crystal growth using experimental and global simulation,"; Journal of Crystal Growth: 266 (2004) pp. 28-33.

Glazov, et al.: "Physicochemical Principles of Semiconductor Doping"; pp. 140-147, (1968).

Surface Science Technology Series 3: "Science of Silicon": USC Semiconductor Basic Technology Research Group; ISBN: 4-947655-88-7; C3055 P61800E 1996; (English Abstract attached), Jun. 28, 1966.

* cited by examiner

DOPING APPARATUS FOR SIMULTANEOUSLY INJECTING TWO DOPANTS INTO A SEMICONDUCTOR MELT AT DIFFERENT POSITIONS AND METHOD FOR MANUFACTURING SILICON SINGLE CRYSTAL USING THE DOPING APPARATUS

This application is a U.S. National Phase Application under 35 USC 371 of International Application PCT/JP2008/059509 filed May 23, 2008.

TECHNICAL FIELD

The invention relates to a doping device and a method for manufacturing a silicon monocrystal.

BACKGROUND ART

For growing a monocrystal by a CZ (Czochralski) method, so-called codoping has been performed in which a primary dopant such as red phosphorus (P) or arsenic (As) that is solid at normal temperature and is evaporated near a surface of a semiconductor melt is injected together with a secondary dopant such as germanium that is solid at normal temperature and is liquefied near the surface of the semiconductor melt.

For codoping, the secondary dopant is injected into the semiconductor melt and then dopant gas generated by evaporation of the primary dopant is squirted onto the semiconductor melt.

However, when the secondary dopant is directly dropped into the semiconductor melt, the semiconductor melt scatters due to the drop of the secondary dopant, and foulings on a chamber or a furnace are dropped off during pull-up, which hampers monocystallization.

Thus, Patent Document 1 has suggested that a low-melting-point dopant as a secondary dopant is loaded into a low-melting-point-dopant injection tube which has a side wall and an upper portion hermetically sealed and a grid-like net formed on a lower portion, and the low-melting-point-dopant injection tube is soaked in a semiconductor melt, so that the low-melting-point dopant is melted by heat of the semiconductor melt and mixed with the semiconductor melt (for example, see Patent Document 1).

Patent Document 1: JP-A-2004-137140

DISCLOSURE OF THE INVENTION

Problems to Be Solved by the Invention

However, according to the technique disclosed in Patent Document 1, after the secondary dopant is injected using a doping device for the secondary dopant, the doping device for the secondary dopant is replaced to another doping device for a primary dopant to inject the primary dopant. Thus, operation may be cumbersome and complicated.

An object of the invention is to provide a doping device and a method for manufacturing a silicon monocrystal capable of considerably simplifying a dopant injecting operation for codoping of a primary dopant and secondary dopant.

Means for Solving the Problems

According to an aspect of the invention, a doping device for injecting two types of dopants into a semiconductor melt includes: a first dopant accommodating portion that accommodates a first dopant that is solid at normal temperature and evaporated near a surface of the semiconductor melt; and a second dopant accommodating portion that accommodates a second dopant that is solid at normal temperature and liquefied near the surface of the semiconductor melt.

Examples of the first dopant include red phosphorus and arsenic, and examples of the second dopant include germanium (Ge).

In this description, "evaporation" means not only a change from a solid to a liquid and further to a gas, but also a change from a solid directly to a gas.

Further, "near the surface of the semiconductor melt" indicates a height from the surface of the semiconductor melt enough to evaporate the first dopant and a height from the surface of the semiconductor melt enough to liquefy the second dopant.

According to the aspect of the invention, since the doping device includes the first dopant accommodating portion and the second dopant accommodating portion, the first dopant and the second dopant can be diffused in the semiconductor melt substantially at the same time by using the doping device in a pulling-up device for a silicon monocrystal.

In the doping device according to the aspect of the invention, the first dopant accommodating portion is preferably shaped in a cylinder having a bottom and includes an opening on an upper portion, and the second accommodating portion preferably includes a dopant holder on which a communicating hole is formed to deliver the liquefied dopant downwardly, and a cover portion that covers the second dopant held by the dopant holder. A guide is preferably provided by a cylinder body of which a lower end is opened and an upper end is closed to accommodate the first dopant accommodating portion and the second dopant accommodating portion, the guide guiding dopant gas generated by evaporation of the first dopant to the surface of the semiconductor melt.

In the second dopant accommodating portion, a conduit tube may be provided below the communicating hole. However, the conduit tube may not be provided.

According to the aspect of the invention, dopant gas, which is generated by evaporating the first dopant in the first dopant accommodating portion by heat of the semiconductor melt, flows into the guide from the opening provided on the upper portion of the first dopant accommodating portion. Since the upper portion of the guide is closed, the dopant gas flowing into the guide flows downwardly along an inner surface of the cylinder body to be diffused in the semiconductor melt from the opening provided at the lower end of the guide.

On the other hand, the second dopant in the second dopant accommodating portion is liquefied by heat of the semiconductor melt, and the liquefied dopant flowed from the communicating hole is diffused in the semiconductor melt.

Accordingly, using one doping device, two types of dopants can be injected into the semiconductor melt substantially at the same time. Thus, dopant injecting operation for codoping can be considerably simplified.

In the above arrangement, the communicating hole is preferably shaped in an elongated hole.

Since the communicating hole is shaped in an elongated hole, the liquefied dopant is prevented from being accumulated due to surface tension or the like. Thus, the liquefied dopant can be quickly delivered into the semiconductor melt.

In the above arrangement, the second dopant accommodating portion preferably includes a conduit tube provided on a lower portion of the dopant holder for delivering the liquefied second dopant flowed from the communicating hole to the surface of the semiconductor melt.

The conduit tube provided on the lower end of the second dopant accommodating portion may not be soaked in the semiconductor melt when the second dopant is dissolved, and may be soaked in the semiconductor melt when the liquefied dopant flows downwardly to be used for doping. Conversely, the conduit tube may be soaked during dissolution and may not be soaked during doping. Further, the conduit tube may be soaked or may not be soaked during both of dissolution and doping.

In this arrangement, since the second dopant accommodating portion has the conduit tube, the second dopant liquefied in the dopant holder of the second dopant accommodating portion can be injected into the semiconductor melt without scattering of the liquefied dopant. Especially, by soaking the conduit tube in the melt when the second dopant is liquefied and doped, scattering of the liquefied dopant can be reliably prevented.

In the doping device according to the aspect of the invention, a vent for degassing is preferably provided on a part of the cover portion of the second dopant accommodating portion.

In this arrangement, since the vent for degassing is provided on the cover portion of the doping device, pressure in an outer space and an inner space surrounded by the cover portion can be adjusted to prevent the liquefied Ge from being accumulated. Thus, the liquefied Ge can be quickly doped into the semiconductor melt from the communicating hole. In addition, the inner space of the cover portion that covers the Ge of the dopant holder is not hermetically sealed because of the vent. Thus, the semiconductor melt is not sucked into the doping device after being dropped off or thus the doping device is not cracked.

In the doping device according to the aspect of the invention, the second dopant accommodating portion is preferably disposed below the first dopant accommodating portion, and a plurality of hook-shaped engaging pieces are preferably provided on a bottom of the first dopant accommodating portion. The cover portion of the second dopant accommodating portion is preferably provided by a cylinder body having an open upper end, the cover portion having a plurality of projections provided on an upper outer circumference, and the second dopant accommodating portion is preferably suspended from the first dopant accommodating portion by engaging the plurality of projections with the plurality of engaging pieces. Further, a space is preferably provided between the bottom of the first dopant accommodating portion and an upper end surface of the second dopant accommodating portion while the second dopant accommodating portion is suspended.

In this arrangement, when the upper end of the cover portion of the second dopant accommodating portion is opened and the second dopant accommodating portion is suspended by engagement between the engaging pieces and the projections, the space is provided between the bottom of the first dopant accommodating portion and the upper end surface of the second dopant accommodating portion. Accordingly, the inside and outside of the cover portion of the second dopant accommodating portion can be communicated. When the second dopant held by the dopant holder is liquefied, the liquefied dopant can be prevented from being accumulated around the communicating hole due to a pressure state within the cover portion. Thus, the liquefied dopant can be quickly diffused in the semiconductor melt through the conduit tube.

According to another aspect of the invention, a method for manufacturing a silicon monocrystal by growing a crystal after injecting two types of dopants into a semiconductor melt, includes: injecting into the semiconductor melt a first dopant that is solid at normal temperature and evaporated near a surface of the semiconductor melt and a second dopant that is solid at normal temperature and liquefied near the surface of the semiconductor melt substantially at the same time; and growing a silicon monocrystal.

In this description, injecting "substantially at the same time" includes not only a case where the first and second dopants are injected completely at the same time for codoping but also a case where the dopants are sequentially injected at short intervals after a semiconductor material is melted.

The method for manufacturing a silicon monocrystal can be reliably carried out by using the above-described doping device.

As compared with an arrangement for preparing a silicon melt by melting polycrystal silicon (semiconductor wafer material) and the second dopant together and then injecting into the silicon melt the first dopant evaporated after an elapse of a predetermined time, the arrangement according to the aspect of the invention can provide a more highly-monocrystallized ingot and can reduce loss of shape in the ingot.

According to still another aspect of the invention, a method for manufacturing a silicon monocrystal by growing a crystal after injecting two types of dopants into a semiconductor melt, includes: injecting a first dopant into the semiconductor melt within 18 hours after injecting a second dopant into the semiconductor melt, the first dopant being solid at normal temperature and evaporated near a surface of the semiconductor melt, the second dopant being solid at normal temperature and liquefied near the surface of the semiconductor melt; and growing a silicon monocrystal.

With this arrangement, the same advantages as the above-described advantages can be attained.

BEST MODE FOR CARRYING OUT THE INVENTION

Exemplary embodiment(s) of the invention will be described below with reference to the attached drawings.

1. Overall Arrangement

Figure 1:
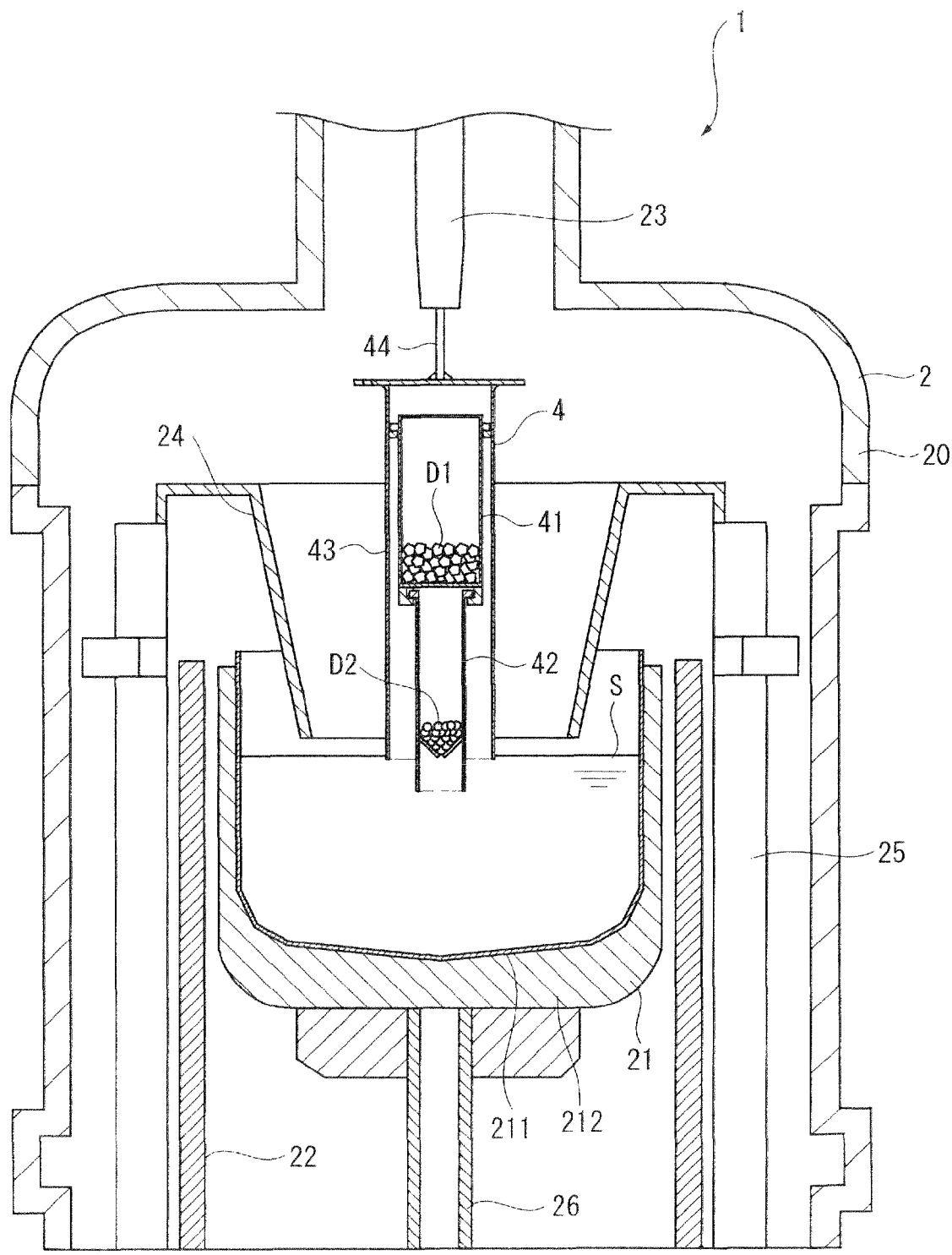
FIG. 1 is a cross-sectional view schematically showing an arrangement of a pulling-up device according to an embodiment of the invention.

FIG. 1 shows an arrangement of a pulling-up device 1 according to an embodiment of the invention.

The pulling-up device 1 includes a pulling-up device body 2 and a doping device 4.

The pulling-up device body 2 includes a chamber 20, a crucible 21 disposed inside the chamber 20, a heater 22 for heating the crucible 21 by heat radiation, a pulling-up portion 23, a shield 24 and a heat insulating cylinder 25.

Inert gas such as argon gas is introduced into the chamber 20 from above to below. Pressure in the chamber 20 is controllable. When doping is performed, the pressure in the chamber 20 is 5332 Pa or more and 79980 Pa or less.

The crucible 21 is used to melt polycrystal silicon, from which a semiconductor wafer is made, to yield a silicon melt. The crucible 21 includes: a first crucible 211 made of quartz and shaped in a cylinder having a bottom; and a second crucible 212 made of graphite and disposed at an outside of the first crucible 211 to house the first crucible 211. The crucible 21 is supported by a support shaft 26 that rotates at a predetermined speed.

The heater 22 is disposed at the outside of the crucible 21 and heats the crucible 21 to melt the silicon in the crucible 21.

The pulling-up portion 23, which is disposed above the crucible 21, is mounted with a seed crystal or the doping device 4. The pulling-up portion 23 is rotatable.

The heat insulating cylinder 25 is disposed so as to surround the crucible 21 and the heater 22.

The shield 24 is a heat-blocking shield for shielding radiant heat radiated from the heater 22 toward the doping device 4. The shield 24 surrounds the doping device 4 and covers the surface of the melt. The shield 24 is shaped in a cone that has a lower opening smaller than an upper opening.

2. Arrangement of Doping Device 4

Figure 2:
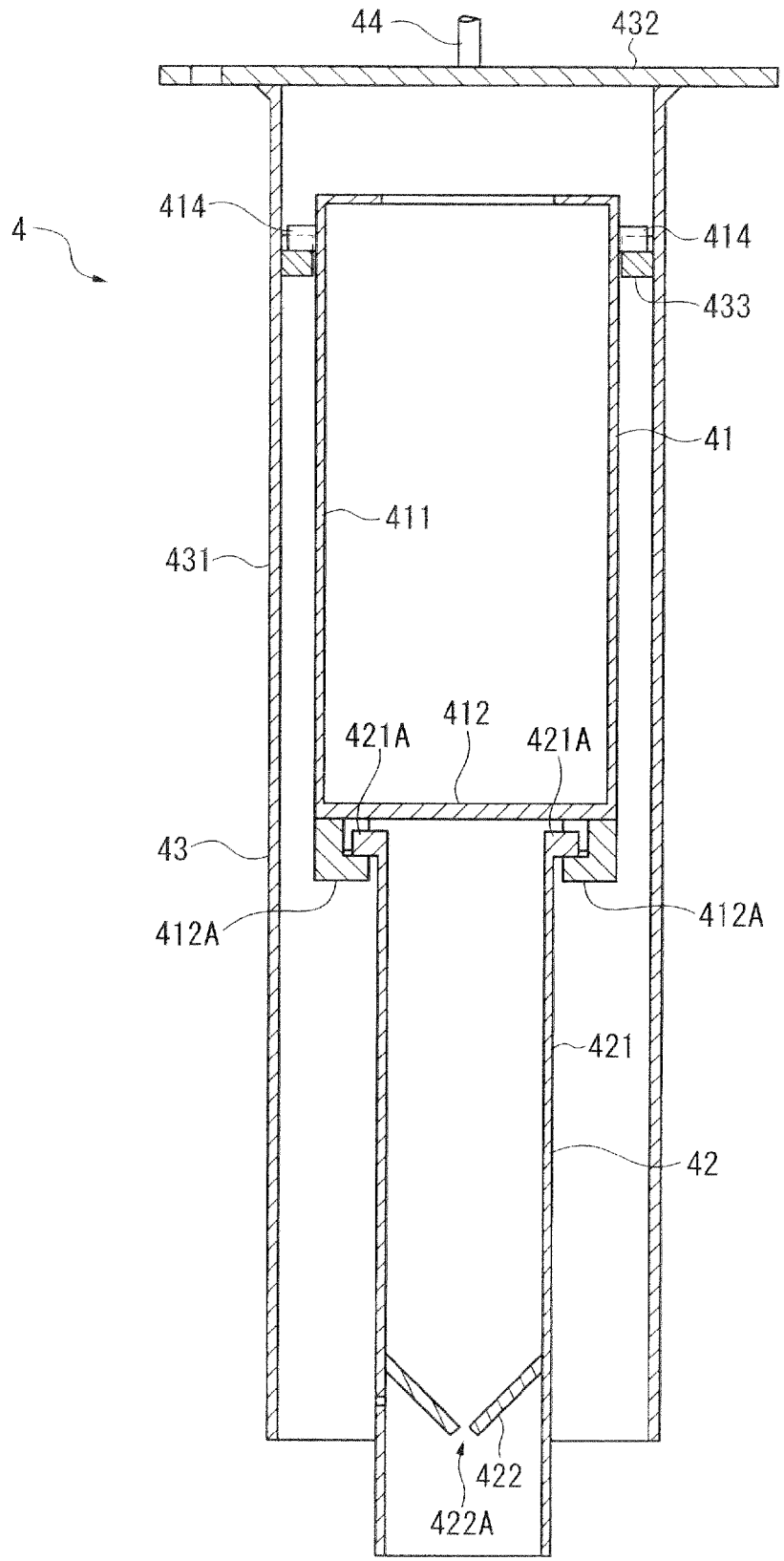
FIG. 2 shows an arrangement of a doping device according to the embodiment.

As shown in FIG. 2, the doping device 4 includes a primary dopant accommodating portion 41, a secondary dopant accommodating portion 42, a guide 43, and a support 44. The secondary dopant accommodating portion 42 is provided below the primary dopant accommodating portion 41. The guide 43 covers an outer side of the primary dopant accommodating portion 41 and the secondary dopant accommodating portion 42. The support 44 is provided on an upper surface of the guide 43. An upper end of the support 44 is attached to the pulling-up portion 23 of the pulling-up device 1 (see FIG. 1).

The primary dopant accommodating portion 41 (first dopant accommodating portion) accommodates a primary dopant D1 which is solid at normal temperature but is evaporated near the surface of the semiconductor melt. The primary dopant accommodating portion 41 is shaped in a cylinder having a bottom. The primary dopant D1 may be, for instance, red phosphorus, arsenic or the like.

Figure 3:
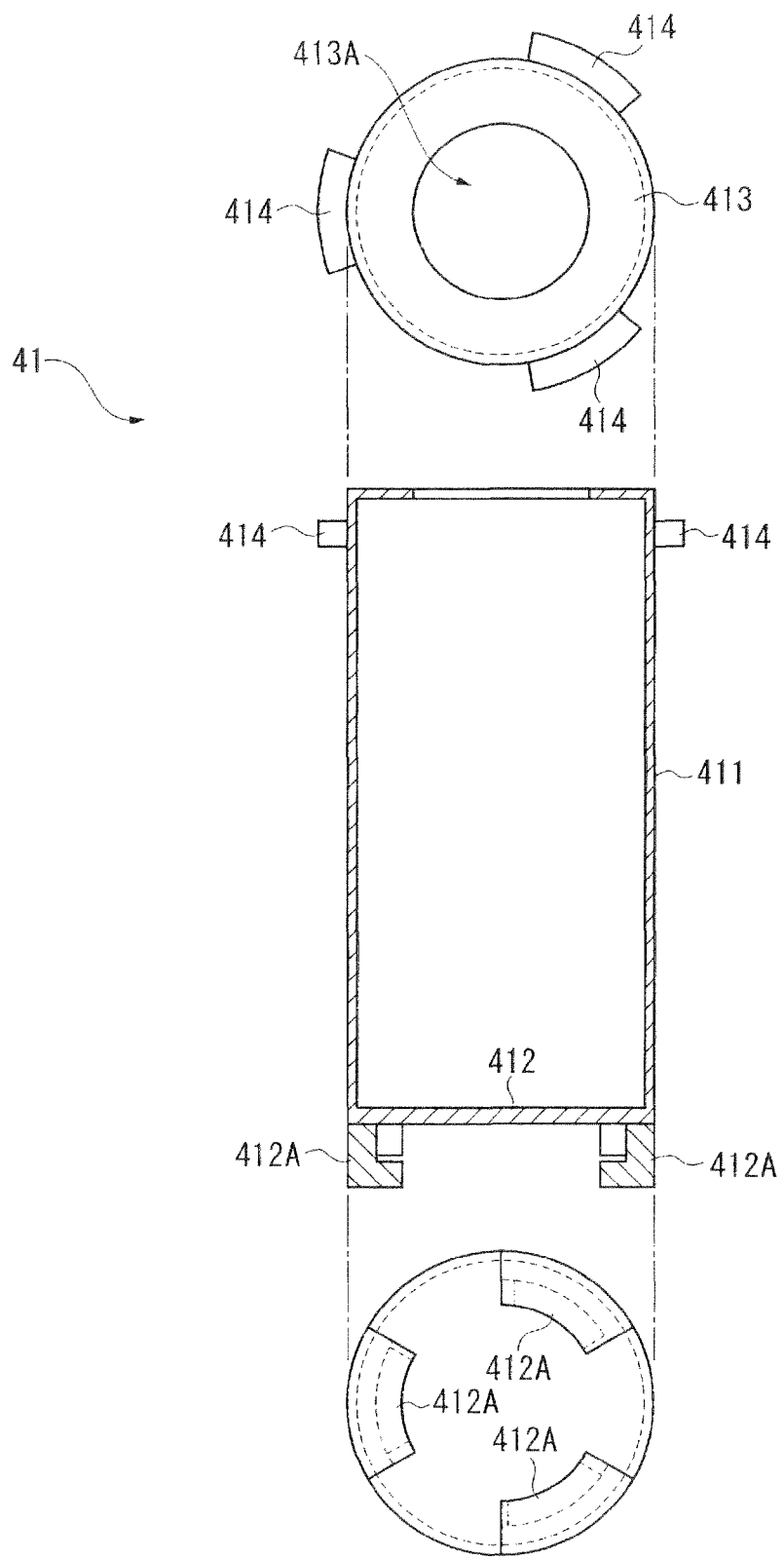
FIG. 3 shows an arrangement of a primary dopant accommodating portion included in the doping device according to the embodiment.

More specifically, as shown in FIG. 3, the primary dopant accommodating portion 41 includes a trunk 411 shaped in a cylinder, a bottom 412 covering a lower end surface of the trunk 411, and a lid 413 provided on an upper end surface of the trunk 411.

A plurality of projections 414 are provided on an upper outer circumference of the trunk 411.

The bottom 412 covers the lower end surface of the trunk 411 and supports the primary dopant D1 accommodated therein. A plurality of hook-shaped claws 412A as engaging pieces are provided to project downward from a lower circumference of the bottom 412.

While the lid 413 covers the upper end surface of the trunk 411, an opening 413A is formed substantially at the center of the lid 413 to deliver dopant gas downwardly when the primary dopant D1 is evaporated.

Figure 4:
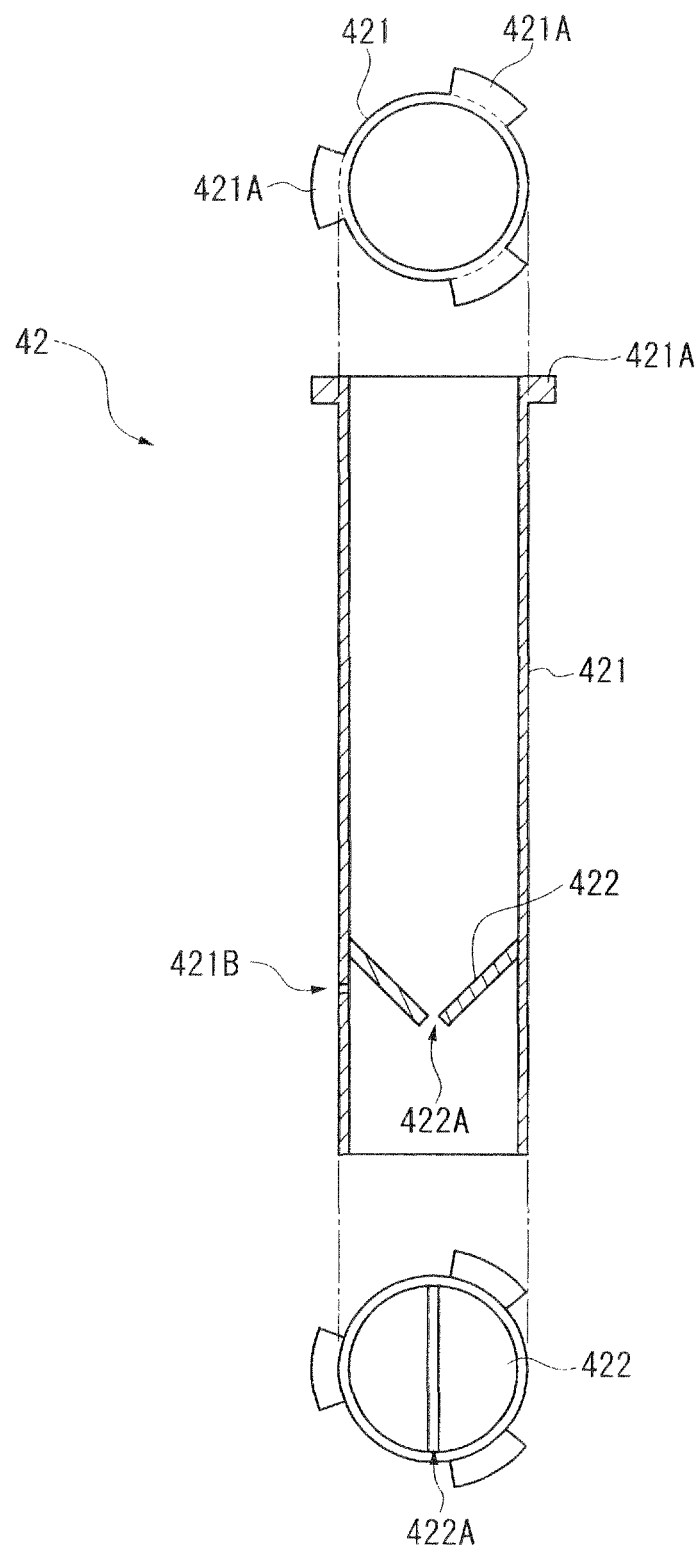
FIG. 4 shows an arrangement of a secondary dopant accommodating portion included in the doping device according to the embodiment.

As shown in FIG. 4, the secondary dopant accommodating portion 42 includes: a cylinder body 421 that has a smaller diameter than a diameter of the trunk 411 of the primary dopant accommodating portion 41; and a dopant holder 422 provided at an intermediate portion inside the cylinder body 421. A lower portion of the cylinder body 421, which is below the dopant holder 422, defines a conduit tube, and an upper portion of the cylinder body 421 defines a cover portion for accommodating a secondary dopant D2. The secondary dopant may be, for instance, germanium.

The cylinder body 421 is shaped in a cylinder of which both upper and lower ends are opened. A plurality of projections 421A are provided on an upper end of an outer circumference of the cylinder body 421. Also, a vent 421B is provided on the lower portion of the cylinder body 421, which is partitioned by the dopant holder 422, to communicate with the inside and outside the cylinder body 421.

The dopant holder 422 is provided by two plates disposed to form a valley shape. An angle between these two plates is, for instance, approximately 90 degrees. A space is provided on a lower end of these plates of the dopant holder 422 to provide a communicating hole 422A.

The communicating hole 422A is an elongated hole connecting inner surfaces facing to each other of the cylinder body 421. In other words, the communicating hole 422A is an elongated hole extending in a diametrical direction of the cylinder body 421. Incidentally, the width of the communicating hole 422A is set to be smaller than a grain diameter of the secondary dopant D2 accommodated inside. For example, the width of the communicating hole 422A is set to be approximately 3 mm. When the width of the communicating hole 422A is too small, liquefied dopant may not be completely injected into the crucible 21 due to surface tension of the liquefied dopant.

The guide 43 prevents inert gas flowing from above to below in the pulling-up device 1 from being directly squirted onto the primary dopant accommodating portion 41, and delivers dopant gas generated by evaporation of the primary dopant D1 into the silicon melt S. The guide 43 includes a trunk 431 and a lid 432.

The trunk 431 is shaped in a cylinder having a large diameter and surrounds the primary dopant accommodating portion 41 and the secondary dopant accommodating portion 42. A plurality of engaging projections 433 are provided on an upper inner surface of the trunk 431.

The lid 432 is shaped in a circular plate to cover an upper surface of the trunk 431. An outer circumference of the lid 432 has a larger diameter than that of an outer circumference of the trunk 431. The above-described support 44 is formed substantially at the center of an upper surface of the lid 432.

The primary dopant accommodating portion 41, the secondary dopant accommodating portion 42, and the guide 43, which are included in the doping device 4, are basically made of quartz. The plurality of projections 414 and the engaging projections 433 of the guide 43 included in the primary dopant accommodating portion 41 may be made of quartz, but also be made of carbon or the like because a surface where quartz components contact with each other may be cracked.

On the other hand, claws 412A of the primary dopant accommodating portion 41 and projections 421A of the secondary dopant accommodating portion 42 are disposed below an engaging portion of the projections 414 and the engaging projections 433, and are exposed to high temperature. Thus, the claws 412A and the projections 421A are preferably made of quartz.

3. Assembly Method of Doping Device 4

For assembling the doping device 4, as shown in FIG. 2, the engaging projections 433 of the guide 43 are initially engaged with the projections 414 of the primary dopant accommodating portion 41. Then, the claws 412A on the lower surface of the primary dopant accommodating portion 41 are engaged with the projections 421A of the secondary dopant accommodating portion 42. Accordingly, the secondary dopant accommodating portion 42 is suspended from the primary dopant accommodating portion 41.

At this time, the projections 421A of the secondary dopant accommodating portion 42 as shown in FIG. 4 are inserted into portions which are not provided with the claws 412A of the primary dopant accommodating portion 41 as shown in FIG. 3, so that the projections 421A can be engaged with the claws 412A by rotating the secondary dopant accommodating portion 42.

When the secondary dopant accommodating portion 42 is suspended from the primary dopant accommodating portion 41, a slight space is provided between a lower surface of the bottom 412 and an upper end surface of the cylinder body 421. Therefore, communication between the inside and outside a portion corresponding to a cover portion of the secondary dopant accommodating portion 42 can be ensured through this space.

Accordingly, an inner space of the cover portion is not hermetically sealed. Thus, when the secondary dopant D2 is liquefied, the liquefied secondary dopant D2 can be prevented from being not easily flowing from the communicating hole 422A due to pressure state in the cover portion.

4. Dopant Injecting Method Using Doping Device 4

Figure 5:
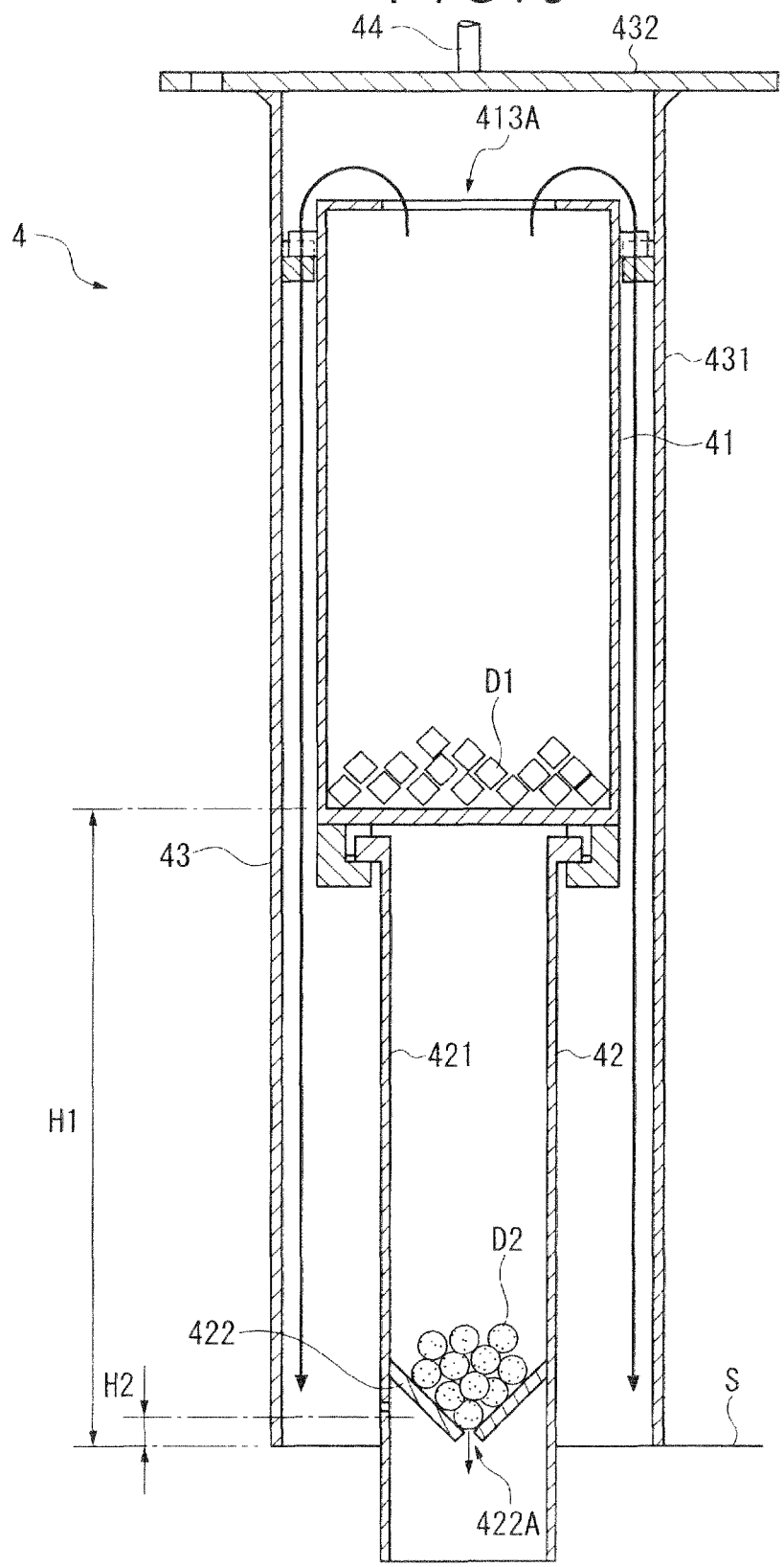
FIG. 5 is an illustration for explaining a doping method using the doping device according to the embodiment.

Next, a method for codoping the silicon melt S with the primary dopant D1 and secondary dopant D2 substantially at the same time using the above-described pulling-up device 1 will be described with reference to FIG. 5.

First of all, the guide 43 is attached to the pulling-up portion 23 of the pulling-up device 1. Subsequently, the primary dopant D1 is loaded into the primary dopant accommodating portion 41 and then the primary dopant accommodating portion 41 is mounted in the guide 43.

Next, the secondary dopant D2 is loaded into the secondary dopant accommodating portion 42, and the secondary dopant accommodating portion 42 is suspended from a lower portion of the primary dopant accommodating portion 41.

After the doping device 4 is assembled, the pulling-up portion 23 of the device body 2 is lowered to soak the lower end of the cylinder body 421 of the secondary dopant accommodating portion 42 in the silicon melt S. Incidentally, a lower end of the trunk 431 of the guide 43 may be soaked or not be soaked.

Here, a height H1 by which the primary dopant D1 is spaced away from a melt surface is preferably set to facilitate evaporation of the primary dopant D1. For example, when red phosphorus is used, the height H1 is preferably approximately 400 mm.

On the other hand, a height H2 by which the secondary dopant D2 is spaced away from the melt surface is preferably set to facilitate liquefaction of the secondary dopant D2. For example, the height H2 is preferably approximately 10 to 20 mm.

When the doping device 4 is held at the position as described above, the primary dopant D1 is evaporated by heat of the silicon melt S to generate dopant gas within the primary dopant accommodating portion 41. The dopant gas is discharged into the outside from the opening 413A of the lid 413.

The discharged dopant gas is reflected by the lid 432 of the guide 43 and is delivered downwardly along the trunk 431 to be squirted onto the silicon melt S and be diffused in the silicon melt S.

On the other hand, the secondary dopant D2 is liquefied by heat of the silicon melt S and is delivered along an inner surface of the cylinder 421 from the communicating hole 422A of the dopant holder 422 to be diffused in the silicon melt S.

5. Advantages

The silicon melt S was doped with germanium (Ge) as the secondary dopant D2 and red phosphorus as the primary dopant D1 substantially at the same time in accordance with the procedures as described above. Then, the doped silicon melt S was pulled up to obtain ingot.

At this time, a doping amount of the red phosphorus was 150 g and a doping amount of Ge was 150 g while a charge amount of silicon was 23 kg.

Figure 6:
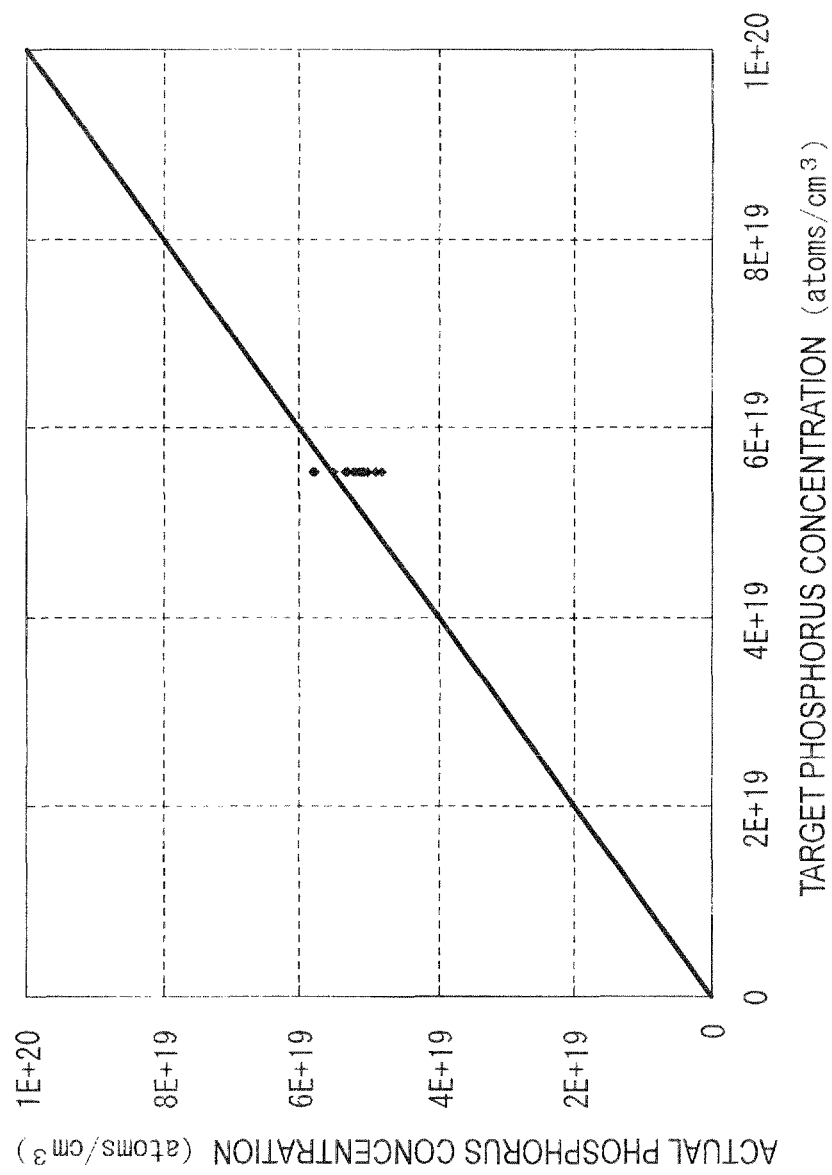
FIG. 6 is a graph for explaining advantages according to the embodiment.

Phosphorus concentration of a top portion of the pulled-up ingot relative to target concentration were checked and found as shown in FIG. 6. Large variations relative to the target concentration were not observed.

Figure 7:
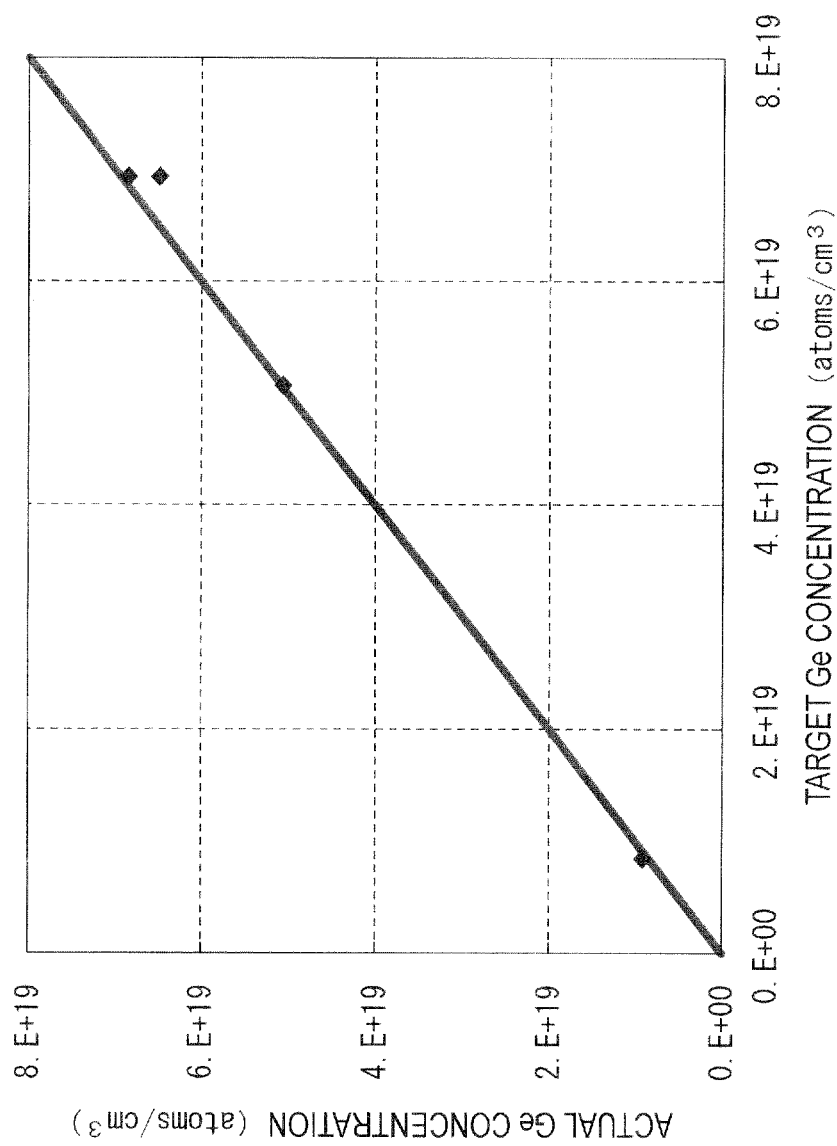
FIG. 7 is another graph for explaining advantages according to the embodiment.

On the other hand, Ge concentration of the top portion of the pulled-up ingot relative to target concentration were checked and found as shown in FIG. 7. Only a few variations relative to the target concentration were observed.

From these results, it has been found that red phosphorus and Ge can be simultaneously doped using the doping device 4 of the embodiment, and also found the doping can be performed without large variations relative to target resistivity using the doping device 4 of the embodiment.

Next, in order to find out advantages when red phosphorus and germanium were used substantially at the same time for codoping using the above-described doping device 4, two procedures were compared. The two procedures were: a procedure in which germanium was initially doped (i.e., a second dopant was melted together with polycrystal silicon from which a semiconductor wafer is made), and then red phosphorus was supplied to pull up ingot; and a procedure in which red phosphorus and germanium were doped substantially at the same time using the doping device 4. A final degree of monocrystallization was 88.0% when germanium was initially doped, and 92.6% when red phosphorus and germanium were doped substantially at the same time. Accordingly, a slight higher degree of monocrystallization was observed when red phosphorus and germanium were doped substantially at the same time.

Figure 8:
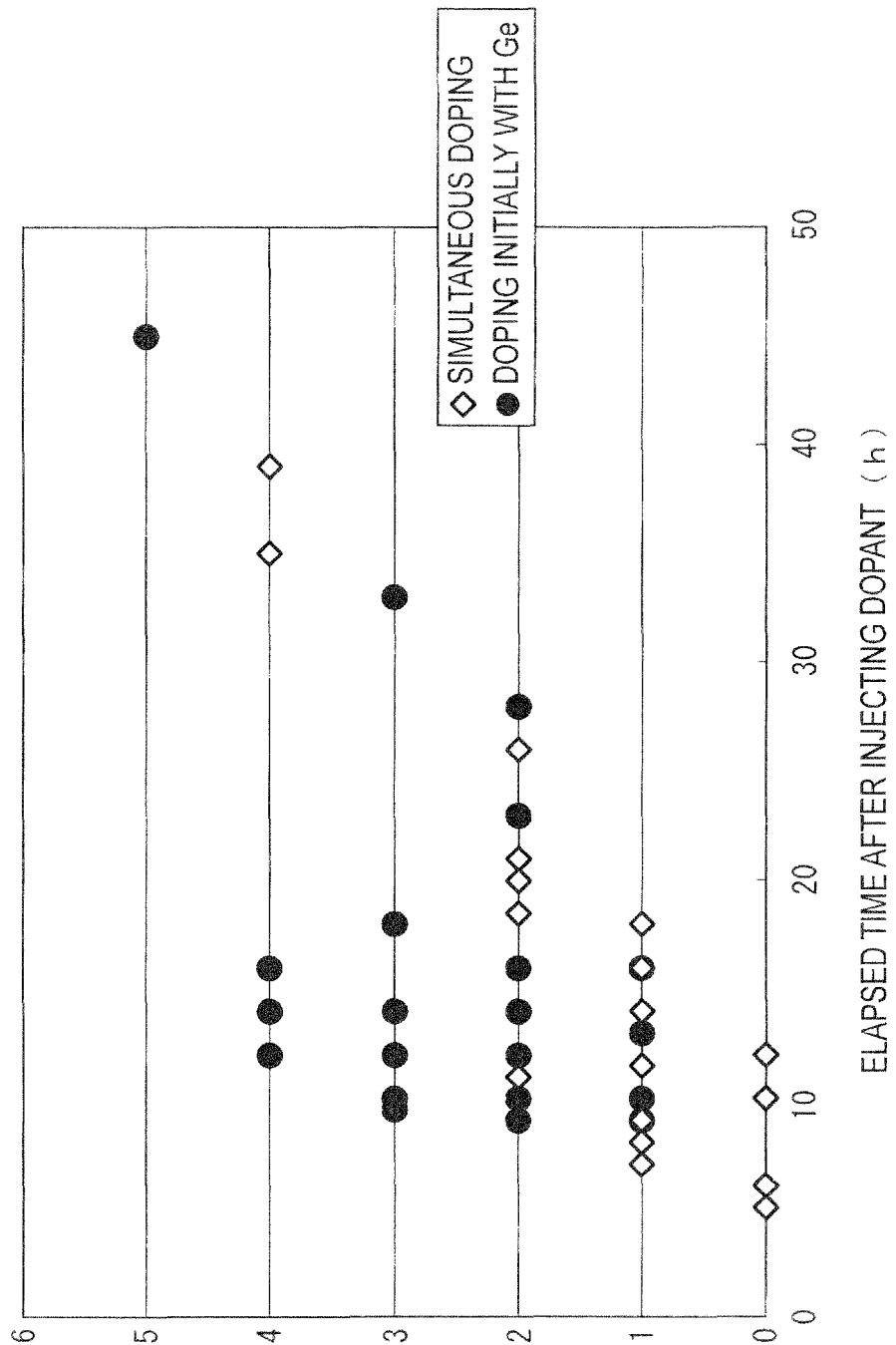
FIG. 8 is still another graph for explaining advantages according to the embodiment.

Then, an ingot initially doped with germanium and an ingot doped with two dopants substantially at the same time were checked so as to see loss of shape in shoulder portions and portions below the shoulder portions of the ingots when the ingots were pulled up. As shown in FIG. 8, the ingot initially doped with germanium exhibited an increase in loss of shape as indicated by a V-shape on the graph around the elapse of 10 to 15 hours after injection of dopants. The ingot doped with two dopants substantially simultaneously exhibited gradual increase in the loss of shape in accordance with an elapse of time after the injection of dopants. Unlike the ingot initially doped with germanium, loss of shape in the ingot doped with two dopants substantially simultaneously was not particularly increased at specific points.

In the case of doping initially with germanium, the germanium is initially melted and then silicon is melted because germanium has a lower melting point. Accordingly, when a silicon melt or solid silicon is mixed with a germanium melt, gas components are mixed in, thereby generating bubbles. Once the bubbles are generated, the bubbles are not easily removed because germanium has large surface tension. Thus, even when dissolution is completely performed, the bubbles are adhered to a crystal in growing the crystal, which may hamper monocrystallization.

On the contrary, in the case of substantially simultaneous doping, a small amount of germanium is gradually added to a large amount of the silicon melt. Thus, bubbles are not easily generated.

The frequency of the loss of shape is increased as time advances presumably because a quartz crucible in a pulling-up device is deteriorated with long-time use, which may have an effect on a final degree of monocrystallization.

In the case of doping initially with germanium, the loss of shape is particularly increased at specific points. Thus, it is required that the melt is pulled up after a long time is elapsed. On the contrary, in the case of substantially simultaneous doping, such a requirement is not necessary and thus better advantages can be attained in view of productivity.

Further, in the case of doping initially with germanium, germanium concentration is decreased after pulling up a second crystal due to segregation effect when a plurality of crystals are pulled up. Accordingly, it is required to add dopant, but only red phosphorus can be added when germanium is initially doped. Since a dopant atom (red phosphorus) and a silicon substrate atom are different in size (covalent bond radius), a silicon monocrystal having a desired characteristic feature in which misfit dislocations caused by generation of internal stress due to deformation of the crystals are prevented cannot be grown.

On the contrary, when red phosphorus and germanium are doped substantially simultaneously, a silicon monocrystal having the desired characteristic feature can be grown.

Further, when the ingot initially doped with germanium and the ingot doped with two dopants substantially simultaneously were compared to see a difference in germanium concentration (i.e., germanium absorption rate) in a crystal relative to an inputted amount of germanium, the ingot initially doped with germanium merely exhibited a germanium absorption rate of approximately 90% while the ingot doped with two dopants substantially simultaneously exhibited a high germanium absorption rate of 98%.

Specific causes why these results were brought are not exactly clear. However, it is assumed that, because gravity of germanium is large as compared to that of silicon, a lower portion of the silicon melt in the quartz crucible may not be uniform to bring these results.

6. Modification of Embodiment

The invention is not limited to the above-described embodiment but may include modifications as described below.

Although the communicating hole 422A, which is provided on the dopant holder 422 included in the secondary dopant accommodating portion 42 as the second dopant accommodating portion, is shaped in an elongated hole connecting the surfaces facing to each other of the conduit tube, the invention is not limited thereto. Specifically, the communicating hole may be circular and the dopant holder 422 may be funnel-shaped.

Also, although the secondary dopant accommodating portion 42 is disposed below the primary dopant accommodating portion 41 in the dopant device 4, the invention is not limited thereto. In short, as long as dopants accommodated in the respective dopant accommodating portions are disposed at such height positions that the dopants can be melted by heat of the silicon melt S, both of the dopant accommodating portions may be disposed at the same height from the silicon melt S. A positional relationship between the first dopant accommodating portion and the second dopant accommodating portions may be reversed.

Further, although the cylinder body 421 serving as the conduit tube is soaked in the silicon melt S both of when the secondary dopant D2 is liquefied and when the liquefied dopant D2 is doped in the above-described embodiment, the invention is not limited thereto. The doping may be performed without soaking the cylinder body 421 at all. Alternatively, the doping may be performed with soaking the cylinder body 421 only when the secondary dopant D2 is liquefied or only when the liquefied dopant D2 is doped.

Furthermore, the dopant holder 422 of the secondary dopant accommodating portion 42 is provided at the intermediate portion of the cylinder body 421, and the lower portion of the cylinder body 421 below the dopant holder 422 defines the conduit tube in the above-described embodiment. However, the invention is not limited thereto.

Figure 9:
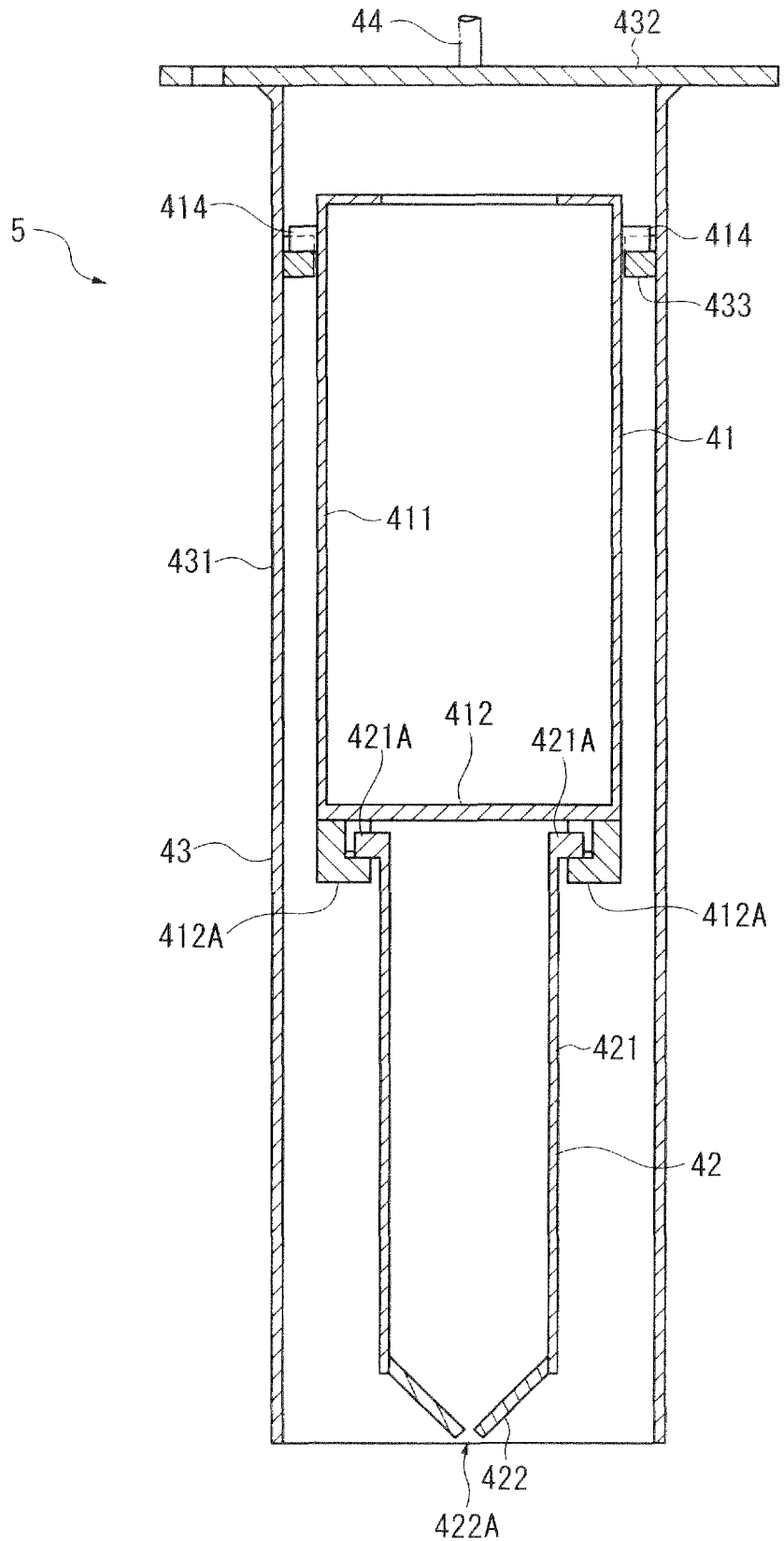
FIG. 9 shows an arrangement of a doping device according to a modification.

Specifically, as shown in FIG. 9, the dopant holder 422 may be provided in the vicinity of the lower end of the cylinder body 421 and dopants may be injected using the doping device 5 without a conduit tube.

In addition, specific structures, procedures and the like for carrying out the invention may be other structures and the like as long as an object of the invention can be achieved.

The invention claimed is:

1. A doping device for injecting two types of dopants into a semiconductor melt, the doping device comprising:
a first dopant accommodating portion that is shaped in a cylinder having a bottom, the first dopant accommodating portion including an opening on an upper portion thereof and supporting from below a first dopant that is solid at normal temperature and evaporated near a surface of the semiconductor melt;
a second dopant accommodating portion that includes a dopant holder that holds a second dopant that is solid at normal temperature and liquefied near the surface of the semiconductor melt, and a communicating hole formed in the dopant holder, and a cover portion that covers the second dopant held by the dopant holder, the second dopant being liquefied by a heat of the semiconductor melt and being injected into the semiconductor melt through the communicating hole; and
a guide that comprises a cylinder body of which a lower end is opened and an upper end is closed, the guide portion being adapted to accommodate both of the first dopant accommodating portion and the second dopant accommodating portion and guiding the first dopant evaporated by the heat of the semiconductor melt into the semiconductor melt at a position different from a position at which the liquefied second dopant is injected into the semiconductor melt through the communicating hole.

2. The doping device according to claim 1, wherein the communicating hole is shaped in an elongated hole.

3. The doping device according to claim 1, wherein the second dopant accommodating portion includes a conduit tube provided on a lower portion of the dopant holder for delivering the liquefied second dopant flowed from the communicating hole to the surface of the semiconductor melt.

4. The doping device according to claim 1, wherein a vent for degassing is provided on a part of the cover portion of the second dopant accommodating portion.

5. The doping device according to claim 4, wherein:
the second dopant accommodating portion is disposed below the first dopant accommodating portion,
a plurality of hook-shaped engaging pieces are provided on a bottom of the first dopant accommodating portion,
the cover portion of the second dopant accommodating portion is provided by a cylinder body having an open upper end, the cover portion having a plurality of projections provided on an upper outer circumference,
the second dopant accommodating portion is suspended from the first dopant accommodating portion by engaging the plurality of projections with the plurality of engaging pieces, and
a space is provided between the bottom of the first dopant accommodating portion and an upper end surface of the second dopant accommodating portion while the second dopant accommodating portion is suspended.

6. A method for manufacturing a silicon monocrystal by growing a crystal after injecting two types of dopants into a semiconductor melt using a doping device, wherein the doping device comprises (i) a first dopant accommodating portion that supports from below a first dopant that is solid at normal temperature and evaporated near a surface of the semiconductor melt, (ii) a second dopant accommodating portion that includes a dopant holder that holds a second dopant that is solid at normal temperature and liquefied near the surface of the semiconductor melt, and a communicating hole formed in the dopant holder, the second dopant being liquefied by a heat of the semiconductor melt and being injected into the semiconductor melt through the communicating hole, and (iii) a guide that guides the first dopant evaporated by the heat of the semiconductor melt into the semiconductor melt at a position different from a position at which the liquefied second dopant is injected into the semiconductor melt through the communicating hole, and wherein the method comprises:
    simultaneously injecting into the semiconductor melt the first dopant and the second dopant using the doping device; and
    growing a silicon monocrystal.

* * * * *